United States Patent [19]
DuBruco

[11] Patent Number: 5,231,281
[45] Date of Patent: Jul. 27, 1993

[54] SUPER-CCD WITH DEFAULT DISTRIBUTION AND ITS FABRICATION

[75] Inventor: Denyse DuBruco, West Allis, Wis.

[73] Assignee: Scabbard Technology, Inc., West Allis, Wis.

[21] Appl. No.: 851,503

[22] Filed: Sep. 12, 1990

[51] Int. Cl.[5] .............................................. H01J 40/14
[52] U.S. Cl. .................................... 250/208.1; 250/226
[58] Field of Search ............................ 250/208.1, 226; 357/30 H; 358/213.16, 213.17, 213.23, 213.26, 213.18

[56] References Cited

U.S. PATENT DOCUMENTS

| | | | |
|---|---|---|---|
| 4,791,493 | 12/1988 | Ogura et al. | 250/208.1 |
| 4,792,671 | 12/1988 | Masaki et al. | 250/208.1 |
| 5,010,245 | 4/1991 | Dierikx | 250/208.1 |
| 5,023,443 | 6/1991 | Komatso et al. | 358/213.18 |
| 5,070,236 | 12/1991 | Miyake | 358/213.18 |

*Primary Examiner*—David C. Nelms
*Attorney, Agent, or Firm*—Nilles & Nilles

[57] ABSTRACT

A photosensitive imaging device including a planar array of photodiodes arranged in lines and cross points and corresponding output circuitry generates a multichannel output signal simultaneously from a sub-array of photodiodes. Clock circuitry gates output signals from the photodiodes. The clock circuitry includes a first set of gate circuitry corresponding to the lines of the array and a second set of gate circuitry corresponding to the cross points of the array. Activation of a number of the first gates and a number of the second gates feeds output signals from a contiguous area sub-array of the photodiodes. Separate connector wires from each photodiode transmits the output signals to a set of rail wires constructed on layered substrates. The rail wires are constructed so that the multichannel output signals from alternating groups of photodiodes are fed to separate sides of the array for processing. The array is further divided into segments. Each segment has its own gate circuits for the lines of the segments, and all segments have common gate circuits for the columns of the array. An output signal is generated simultaneously from at least one sub-array in each segment, thereby increasing the signal output rate by a factor of the number of segments.

17 Claims, 8 Drawing Sheets

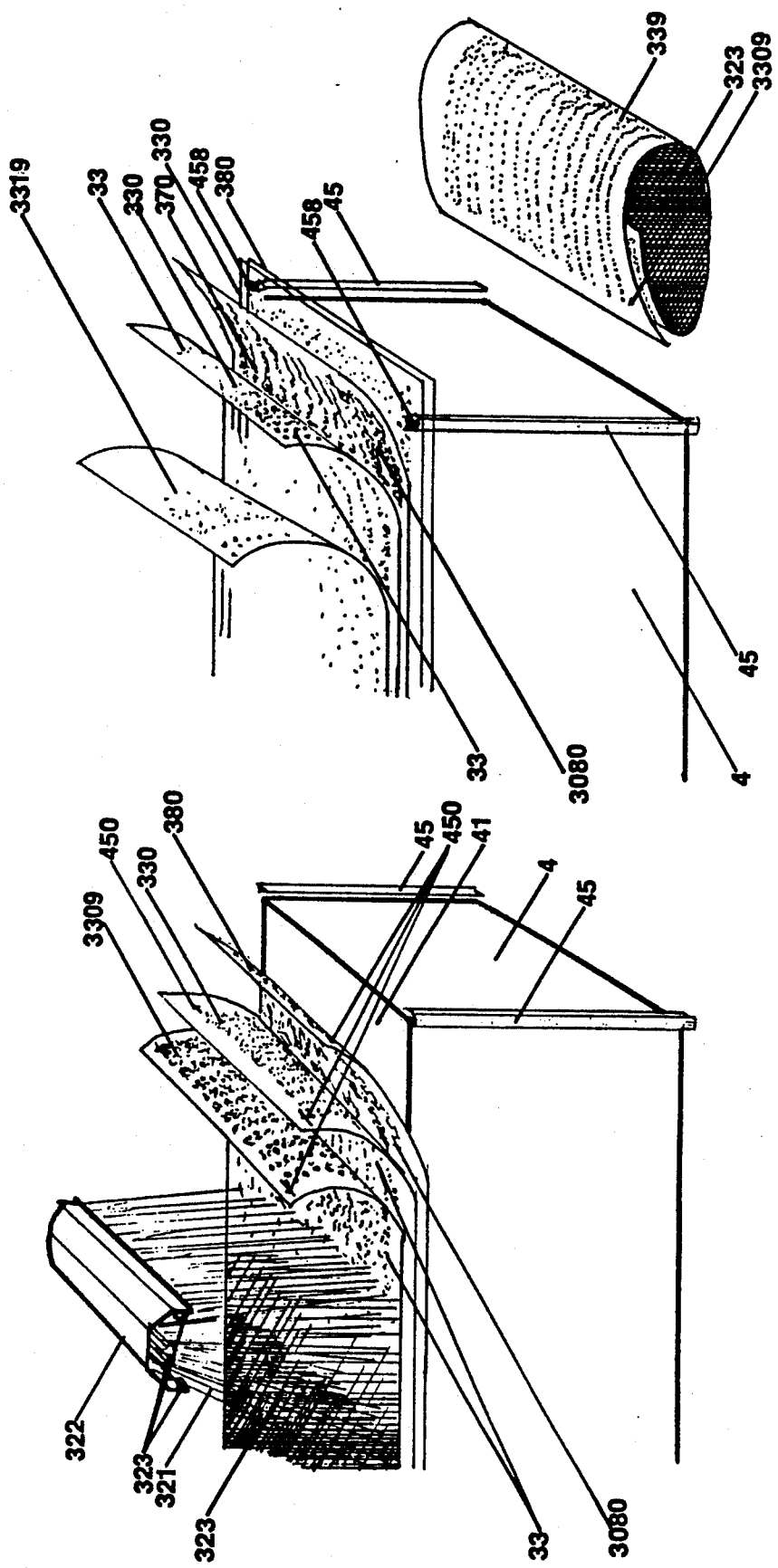

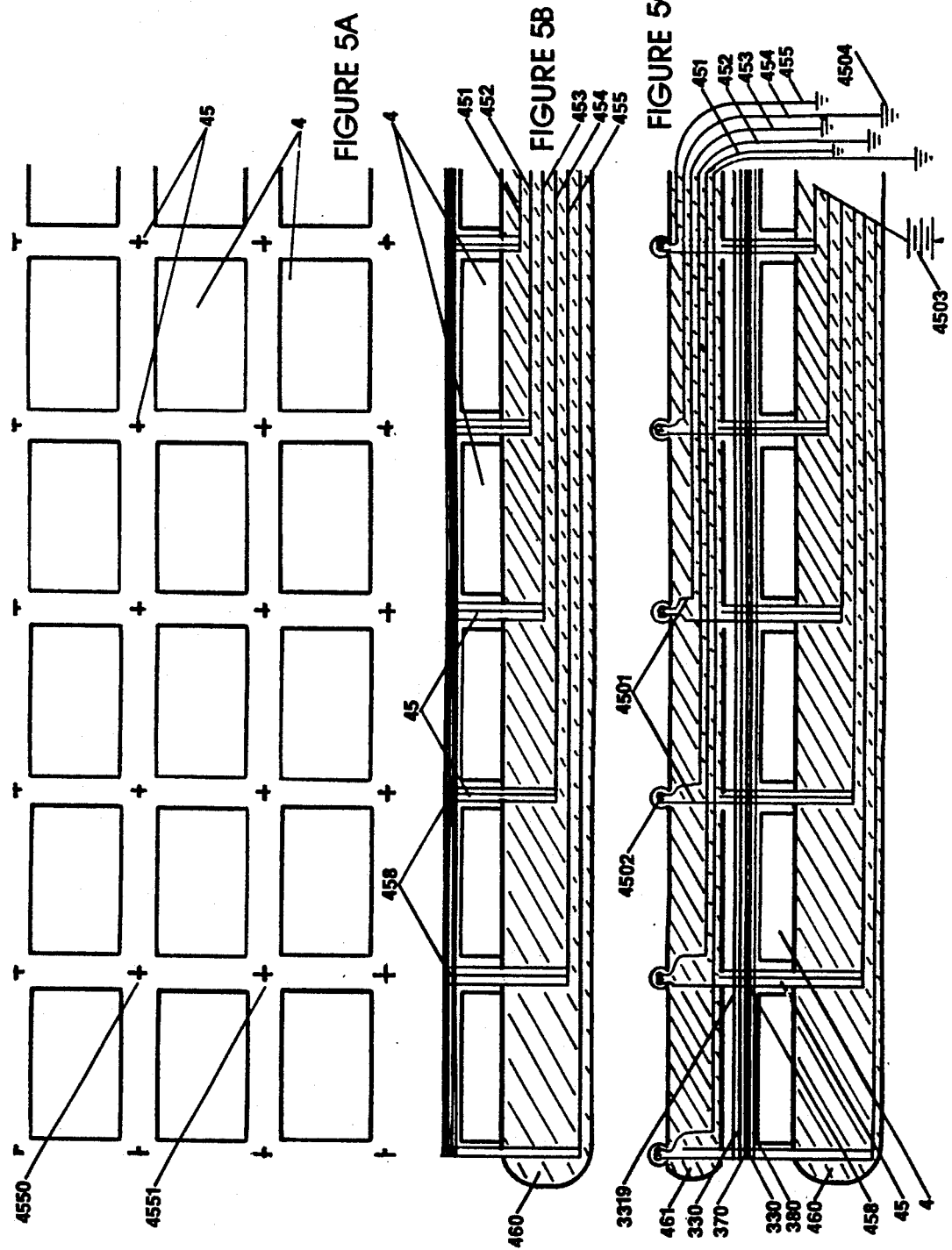

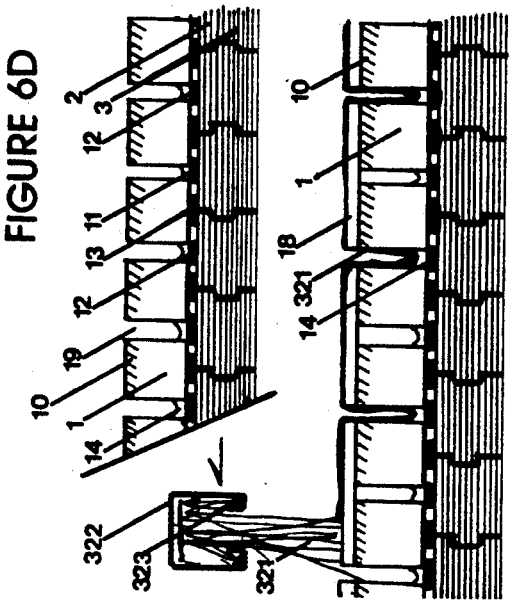
FIGURE 6A
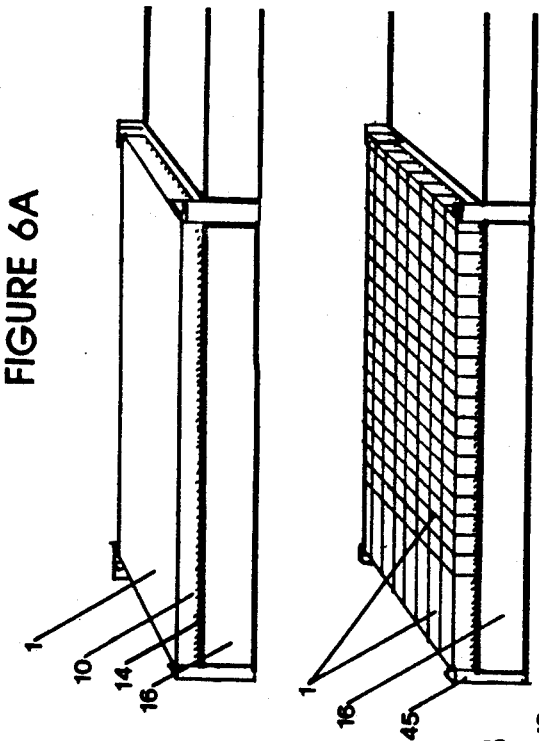
FIGURE 6B
FIGURE 6C
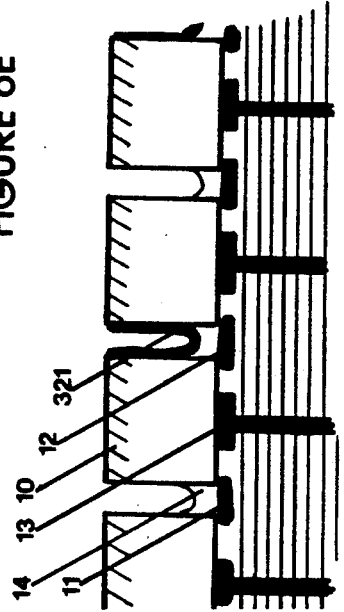
FIGURE 6D
FIGURE 6E
FIGURE 6F
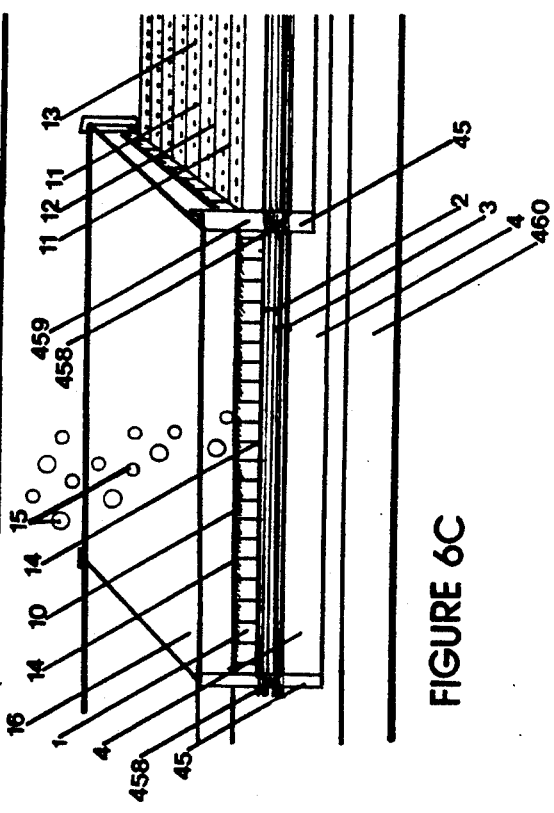

SUPER-CCD WITH DEFAULT DISTRIBUTION AND ITS FABRICATION

BACKGROUND

Currently Charge Couple Devices over an area as needed in video cameras have an incremental price increase per number of units in the array that makes useful high definition television arrays just too expensive because of the high level of cull rates due to faulty lines of output. There needs to be a means to distribute the default data such that integration can correct for nonfunctioning output. And, a mass production means of producing these chips will increase the supply aiding in price reduction. Current trends toward X-ray Lithography means of production are costly at this point. The extremely minute detail of the circuits for these arrays also increases the cost.

Working at the micron and submicron dimensions in fabricating optical chips required either a stencilled evaporative building or photoresist etching of materials. Insulators between subsequent layers of circuitry for charge integrity is also required. Lamination processes exist and if done in vacuum as 10~6 mm of Hg, leave no bubbling over a wide range of atmospheric pressure applications. The designed eight or more layer Super CCD needs fabrication reaching quarter micron scale for detail.

THE INVENTION

Summary

Were the defaults to affect only one in 25 units of a display across the line, an integration circuit can put into the default slot the most likely color either matching those on the neighboring sides, or if sides have variance in color levels choose the most likely color level among them based on pattern theory. The invention here distributes the default output were a line not functioning such that the neighboring colors would be available. It is done by distributing the photodiode output in five rails (separate signal bands) and having five lines in the same interface direction. This gives the output of the 25 points simultaneously allowing the pixel definition for constant color or color variance, majority color and full 25-point definition at signal output. This output can then be integrated in to the gross signal allowing either an augmentation-type output with NTSC and definition of majority color pixels or NTSC plus a simulcast signal which carries the largest definable color blocks for each section of the picture. The Augmentation vs Simulcast signal type is determined by second stage logic chips.

Using the most fine mylar or other flex circuit substrate, using a three layer matrix of printed circuit and perforated substrate with X-ray optical alignment and conductive substrate evaporation, the entire proposed photodiode array with two or more layers of clock-related transistors and five or more layers of Charge Coupling Device CCD circuit output layers overlayed with the photodiode cube arrays doped for dielectric characteristics peaking photosensitivity at the wavelength bands they receive in application combines into the ideal photochip for video applications. Light exposure is measured by the voltage drop over the period of exposure. Power and ground leads to the silicon or other material base chips provide the known voltage level. The charge is dissipated through the clock transistor gates and passed down the CCD circuit lines in twenty five or more sources at one time.

Cutting of stencils and perforations can be done with proper power level, low wave length laser beams which destruct the mylar substrate, but not the mask materials. The parallel light provides the thin layer dimensional stability in the stencil position and shape. Each segment is corner cut to align components as a printer does to keep in register multicolor printing operations. In sequential layering, these aligning holes are snapped onto the previous evaporated or sputtered conductive substrates at those positions. In the case of an array of photodiode arrays being produced at one time, the cornering is done at the corner junctions of each chip so as to prevent warping over the area of the full array of chips. The four corner placement is checked by an alignment circuit which falls on the predicted locations of these alignment points and in cases of proper alignment records the proper position by the conductivity at the post locations. Were the alignment not made, the substrate of the mylar would prevent conductivity at that point since it serves as an insulator.

BRIEF DESCRIPTION OF THE DRAWINGS

FIG. 4 is a diagram of the tri-film layering in fabricating the photodiode array chip.

FIGS. 5 is a drawing of one design for the alignment check.

FIG. 6 is a drawing of the adhesive transfer and the means for electrical connection with the top surface of the photodiode chip if required for power input to the photodiode.

DETAILED DESCRIPTION OF THE INVENTION

Figure 1:
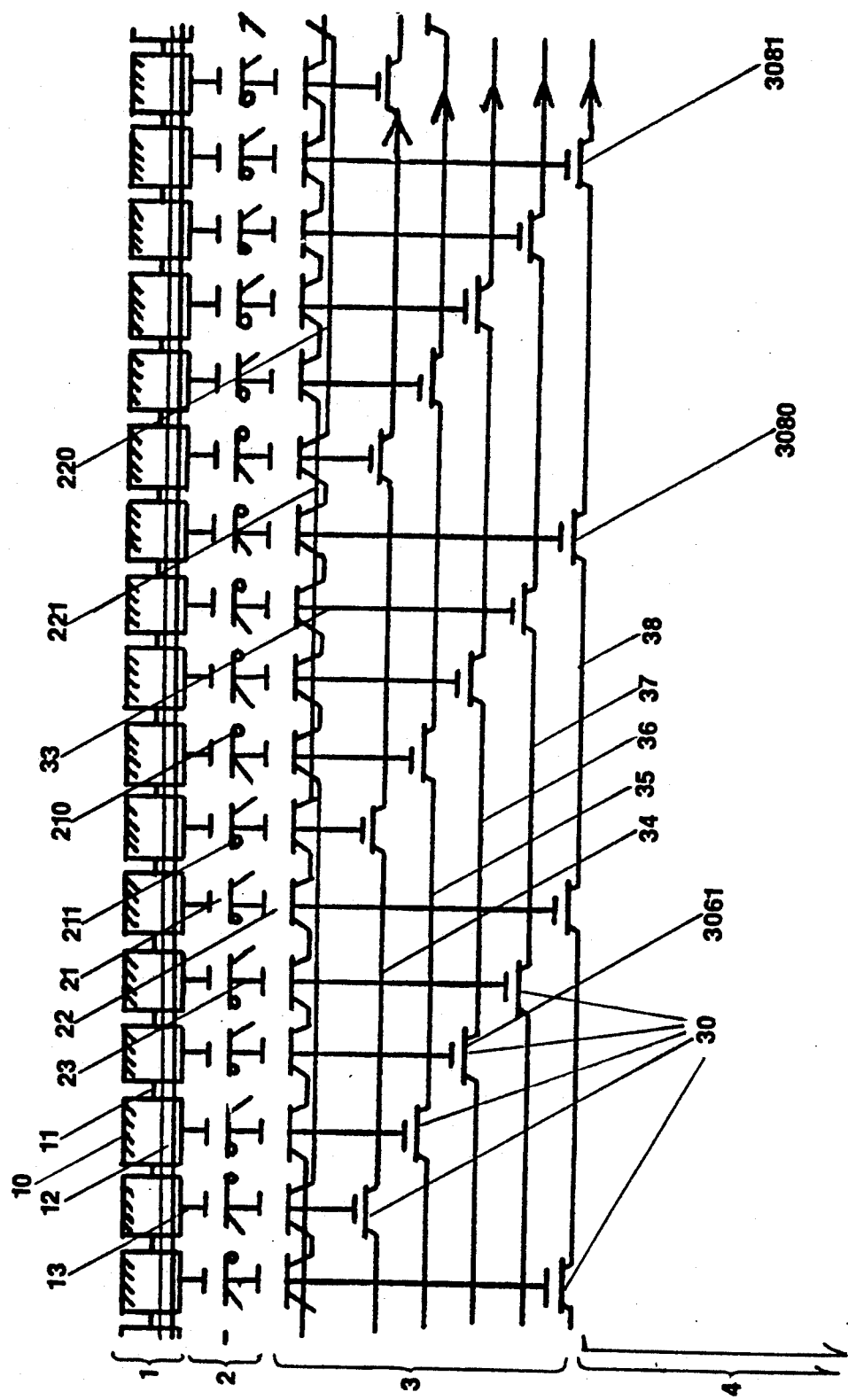
FIG. 1 is a cutaway crosssection of the CCD array showing photosensitive layer, clock control layers and conductive rails.

Referring to FIG. 1, the Super CCD photodiode array 1 has a spanse in both directions of photodiode units having a dielectric coating 10 which dissipates voltage proportional to light levels, voltage input 11 and ground wires 12 and a lead 13 extending to the clock control layer 2. Two measurements are made during the scan, one the voltage recharge level which gives a luminescence factor and the output of the lead which passes through the clock and rail 3 layers where it, in conjunction with four other photodiode units across and four additional rows of five photodiode units present a block of output data all at once.

The clock layer 2 consists of, here shown but not limited to, two sets of transistors, 21, which sets cross sets of five outputs through the gate at a time with activation through the source and out the drain and a second set of transistors, 22, which sets the timing of gate activation for rows of photodiode output. Connector wires, 23, pass signal from transistor base through to the next transistor gate. Connector wires 33 take the current from the base of transistor 22 to the gate of the appropriate transistor in section 3 which has five layers of transistors 30 thus separating the signal for five photodiode units in a row. For this reason connector wires 33 vary in depth depending on the level of transistor 30 they attach to depending on which rail, 34 through 38, they feed into.

Not shown, but described is the fact that the alternative five row groups rails 3 discharge on opposite sides of the SuperCCD. FIG. 1 shows a row discharging to the right. Five rows inward of the rows will discharge to the left emulating the order of the raster scan for camera slave displays.

The clock layer wires 220 and 221 carry signal to alternate groups of five photodiode output transistors 22, and conversely, wires 210 and 211 alternate crosswise five photodiode output transistors 21. This activates signal to 25 photodiode units in a square pattern which is what is analyzed in the output shown in FIG. 3 for each pixel, being that group of 25 and all subsequent groups of 25 outputs from square patterns of photodiodes. This creates the timing as the voltage is activated for the row and than the timers release five data points at a time in five rows in one direction.

Rail layer 3 carries what is referred to as the bucket brigade of signal levels representing the light levels measured during the signal entrance interval for the photodiode dielectric layers 10. Some signal adjustment can be added from the voltage comparison along that line when the Vo−Vi difference where V0 is the fully charged voltage and V is the voltage level after being illuminated for the interval of light. This voltage drop is proportional to the light exposure level. Feeding this into an evaluation circuit could substitute for adjusting the lens F-stop by regulating the length of light exposure for each frame cycle.

Layer 4 is the base substrate of the photodiode array chip which we title here the SuperCCD. Lead support for the fully developed chip is provided by this layer as well as the structural integrity of the electronic component here designed.

Figure 2:
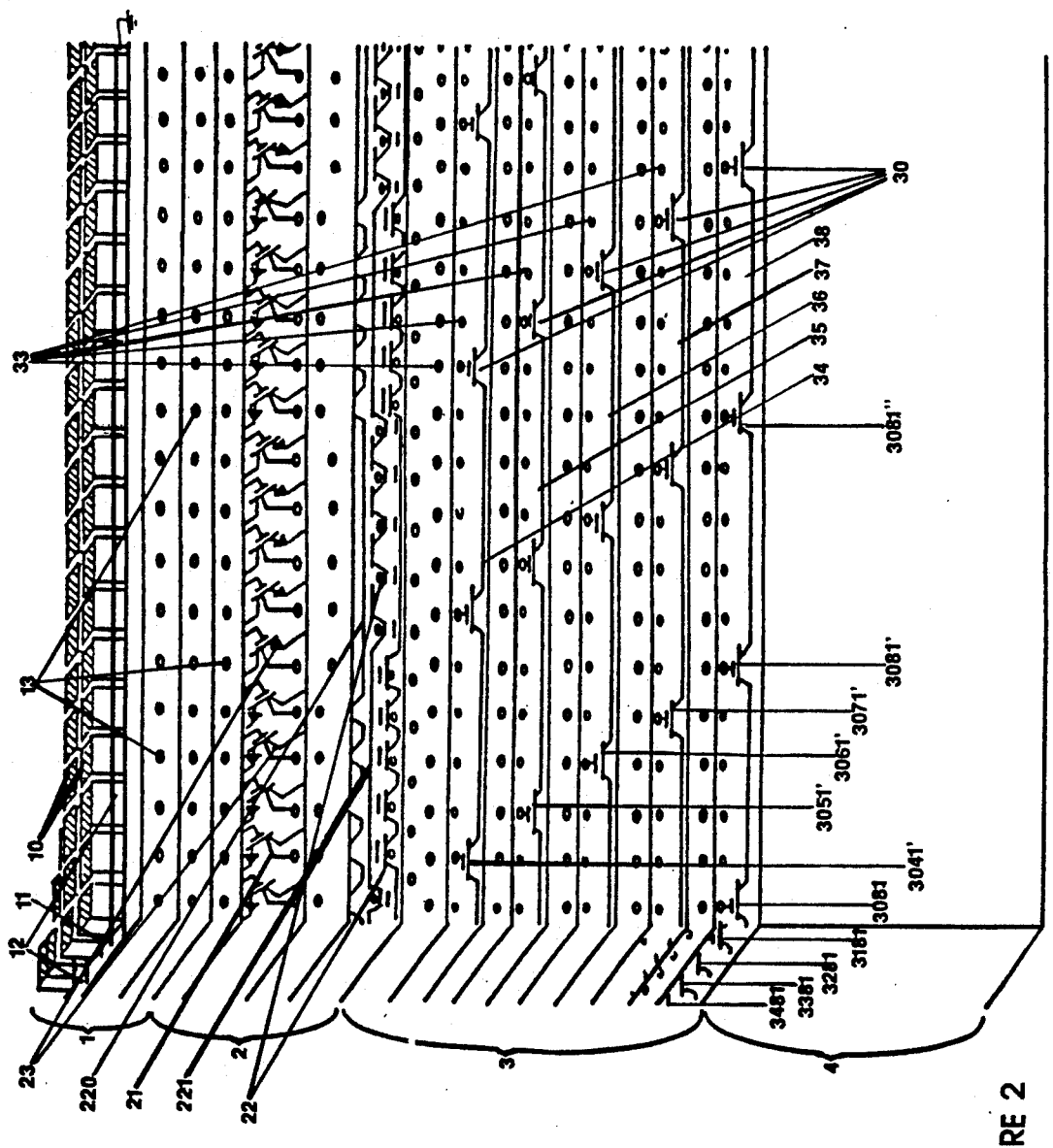
FIG. 2 is a cascade of layers as would be provided through minimicrodeposition, X-ray Lithography, and etching.

FIG. 2 shows layer construction and wire transport between component layers as would be appropriate in defining masks for sputter or evaporative depositing of circuit components and for X-ray Lithography. With square photodiode units planned, the masks can be reused several times during the layering process used in producing these SuperCCD chips.

Because the layering starts on the substrate 4, the discussion will begin with template masks for layer 3, the rails, first. Though there are five layers of transistors placed on a planar array, the mask can be reused for each layer by displacing it one set of photodiodes to the left for each sequential layer. The wire passage layer 33 is reused for each layer. Where wires are not required, a mask can cover the area just under the last transistor to stop the signal from penetrating lower levels if that is necessary. Creating a transistor in electronic integrated circuitry is common practice and should be transposable to these very small area units. In summary, to create layer 3, ten treatments are needed, five layering the transistors 30 for rails or cross wires 34–38 and five layers of wire passage for wires 33.

Ends of the rows of rails 34–38 and the other four neighboring rows constituting the pixel area in the case of the 25 unit pixel integrate into a wire array discharging the 25 units of pixels in order of firing evaluating whether the color level among the 25 units is one level or more than one. If one level, it is sent as a single signal, if more than one, the full pattern of 25 is defined.

If the complete imaging system is monochrome, the grey scale levels through 256 are defined and repeat pattern groups of these levels are grouped and levels numbered with two or three bits, four or eight levels.

If the complete imaging system is color, red, green and blue RGB outputs are combined after the original sorting of one vs. more than one intensity level output and if all three output for a single pixel has one color level for the RGB combined signal, then the single signal with defined color levels is output. If one or two of the RGB components has variation, the full 25 unit pixel definition is provided as is the case of the combined input for pixels with more than one color. At this level the 256 levels for each color are used and these levels are referenced through the established palettes for previous frames or earlier parts of this frame scan and the code for the color block and specific hue is provided. If it is a new color in an old color block, the next digit is used to identify the specific new color.

However, if the color block is new, the new block is coded and the levels of color are coded starting with 0 and numbering as many color variations as is found within the new block. This code then applies to further colors within the color block in pixels within this frame and in subsequent frames.

With feed off of the pixels interlaced where one line goes off to right and the second to the left, color blocks can be formed at both feed off sides and chromatic levels compared combining left and right signal into one whole color block giving another check for consistency and more input for default correction which is discussed later.

Layer 2 aligns a complete set of transistors on the 33 wires emerging where the groups of five signal paths in each direction are activated. The mask for the transistors can be used first in the long-wise direction and then crosswise separated by the wire template with slightly displaced wire paths 23. In the transistors, the direction of source and drain flow alternates between rows of five photodiode sources using wires 220 for one direction and 221 for the other in the lower layer of clock transistors 22. The layer of transistors 21 have similarly alternating five pack source directional changes. This power sourcing is accommodated in the lead patterns to the SuperCCD chip.

Layer 1 uses the wire lead mask used in layer 3 feeding into the deposited photodiode. The block silicon which is given a dielectric coating on the outer surface peaking the sensitivity in the center of the wavelength band received forms the photodiode 1 coated at 10 and charged with voltage line 11 with ground 12 completing the charging circuit. The mask used in layer 3 provides the photodiode leads 13 to the gates of transistors 21 in layer 2.

To give an idea of the size of the dielectric photodiode surfaces 10, the following chart shows a range of array photodiode sizes applicable to lens systems of currently used video cameras:

| Array Diameter | Units in Microns | | | Efficiency % | | Percentage RGB Light |
|---|---|---|---|---|---|---|
| | length | width | trough | Array | System | |
| 1" 25 mm | 4.35 | 4.35 | 0.25 | 89.4% | 80.5% | 26.8% |

-continued

| Array Diameter | Units in Microns | | | Efficiency % | | Percentage RGB Light |
|---|---|---|---|---|---|---|
| | length | width | trough | Array | System | |
| 1" 18 mm | 3.15 | 3.15 | 0.25 | 86.1% | 77.5% | 25.8% |
| ⅞" 16 mm | 2.75 | 2.75 | 0.25 | 84.0% | 75.6% | 25.2% |

Assuming 10% light loss in the system and ⅓ of the light for each color array in a three color video camera system.

These arrays, as planned, to be specific as to the design goal, have 4500 crosspoints and 3150 lines giving a total of photodiode units at 14,175,000 used in a three color system separated by a prism with dichronic coatings on both sides through which the lightpath passes first reflecting off the red light to its photodiode array, then blue to its photodiode array and taking the green light in a straight path from the lens.

Figure 3:
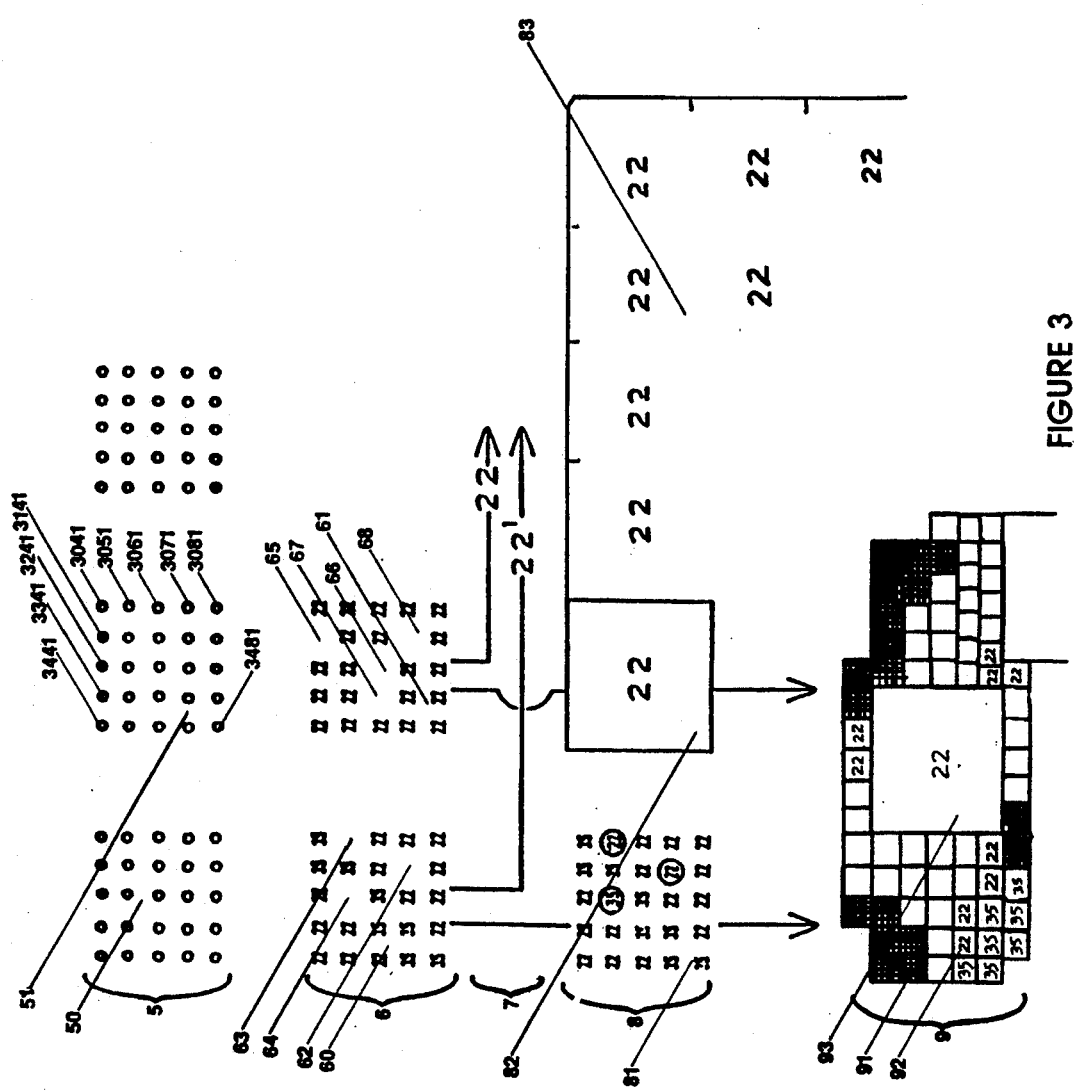
FIG. 3 is a diagram of the data handling from the output of the SuperCCD through the second stage logic chip.
Figure 7A:
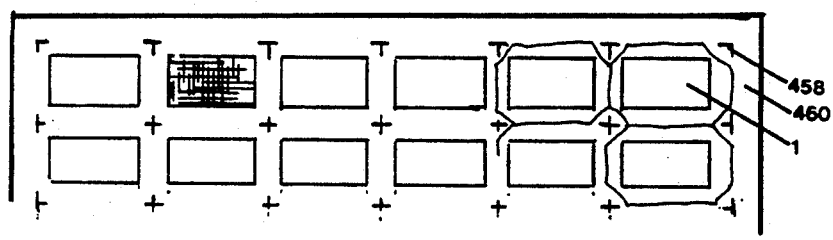
FIG. 7 is a drawing of an array of resulting chips made at one time showing the cutting of common thin film layers for pin frame application.
Figure 7B:
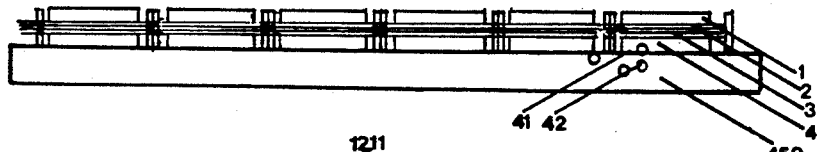
Figure 7C:
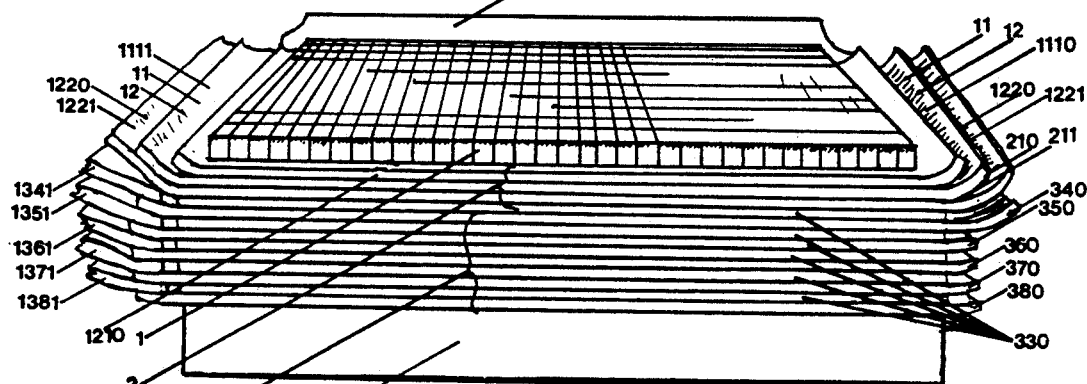
Figure 7D:
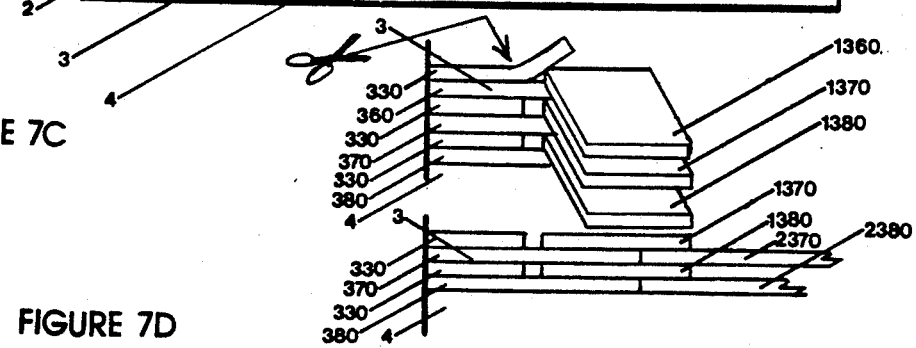

To assist in understanding the information in FIG. 3, the general description of the augmentation-type signal as prepared for the Federal Communication Commission (FCC) advisory committees for the next US Television Broadcast Standard in included herein:

GENERAL DESCRIPTION OF E3TV

The pixel unit in E3TV comprises twenty five subunits in a square array. The color of the pixel is transmitted on Band One of the dual broadcast signal and represents either the common color where all 25 subunits are one color or the majority color when detail exists within the pixel. A binary indicator in the scan tags the majority color pixels for further color definition in Band Two.

RESOLUTION DEFINED BY ASPECT man Alfred Sikes for the next Television Broadcast Standard.

Using a camera photodiode array of 3150 lines, 4500 crosspoints allows editing area. This 10:7 aspect array allows wide screen plus 20 crosspoints and 630 lines surplus thus the image can be edited down to the wide screen aspect and size giving major vertical alignment to catch the desired image. Cropping the 4:3 aspect image, 1000 crosspoint leeway is allowed and 525 lines for selection of the appropriate image area. The cropping exclusion from the camera slave monitor image allows broadcast signal forward and back scanning and beam return to scan start position.

These side spaces allow unit locations for alignment and calibration input for the images so that the three color blocks are aligned and so that the light levels can be continuously calibrated with the known intensity calibration fiberoptic output. This calibration means is defined in the Dec. 29, 1989 filing and is referred to at this point.

Now to address FIG. 3 which illustrates the idea using a 5×5 array pixel which in practice could be reduced or expanded depending on application. The areas here numbered 5 through 9 represent layers of image processing and will be discussed one level at a time.

Area five shows an end-on view of the five by five output array covering five neighboring units in a row, five rows across. It is numbered referencing the rail numbers in layer 3 of FIGS. 1 and 2. Two such arrays are defined, one with a common color level throughout and the other with color variation.

Area 6 has the arrays showing a number level for light. Assuming these are one photodiode array cameras for black and white or monochrome signal the intensity

| ASPECT | 4:3 NTSC Standard | | | | 16:9 Wide Screen | | | |
|---|---|---|---|---|---|---|---|---|
| Pixel number | | | 367,500 | | | | 451,584 | |
| Subunit number | | | 9,187,500 | | | | 11,289,600 | |
| | Blue Sky | | Tree | | Blue Sky | | Tree | |
| RESOLUTION | 1st | 2nd | 1st | 2nd | 1st | 2nd | 1st | 2nd |
| Static Frame | | | | | | | | |
| Horizontal | 700 | 700 | 3500 | 700* | 896 | 896 | 4480 | 896* |
| Vertical | 525 | 525 | 2625 | 525* | 504 | 504 | 2520 | 504* |
| Diagonal | 875 | 875 | 4375 | 875* | 1038 | 1038 | 5190 | 1038* |
| Dynamic | | | | | | | | |
| Horizontal | 700 | 700 | 3500 | 3500 | 896 | 896 | 4480 | 4480 |
| Vertical | 525 | 525 | 2625 | 2625 | 504 | 504 | 2520 | 2520 |
| Diagonal | 875 | 875 | 4375 | 4375 | 1038 | 1038 | 5190 | 5190 |

*once detail is defined, if it does not change it is not repeated on Band Two.
Broadcast Bands: two 6 MHz Standard Video Bands Scan rates supported: NTSC displays 30 Hz E3TV displays 59.94 Hz.

A dynamic resolution may occur when the wind is blowing so the tree top is in motion thus never having sequential frame color definition repeated in sequential frames. However, color blocks remain the same throughout the sequence.

Recently it was discovered that the low resolution NTSC or wide screen signal can be reduced in the exact same means as used to determine the low resolution signal thus defining where possible larger square areas of constant color. This further reduces the data in the broadcast band allowing in most cases a single 6 MHz signal carrying the full resolution signal for video plus audio and other additions to the full carrier signal in broadcast and recorded video applications. This technique produces a Simulcast type signal which is favored by the US Federal Communications Commission Chairlevels here determine whether variation occurs throughout the 5×5 matrix. Matrix 60 carries a signal with intensity variance having two colors, 22 and 35 light levels. Matrix 61 is a one intensity matrix with the level, 22.

To illustrate the default event and how it appears in the divergent source arrays as the five layers of rails in the 3 layer of the chip allows, a "D" is placed in the default or nonfunctioning output locations. The color determination is given in each instance starting with default area 62.

Default 62 is neighbored on all sides by the 22 level light so is assigned light level 22. 63 is assigned a color referencing its neighboring pixel which is solid 22 light level and has in its pixel three 35 levels and two 22 levels with three 22 levels in the neighboring pixel. Therefore, with five 22's and three 35's, it is assigned light level 22 which fits the line pattern of the 35 level ribbon running through the pixel.

Default 64 provides a puzzlement since it has four neighboring subunits at each light level, 35 and 22. How to program this one can be difficult. If the color areas are split as they are here, the color should match the balanced split color giving default 60 the 35 color level. It fits the pattern here.

Defaults in matrix 61 could all be assigned light level 22 since all functioning subunits have that level. Considering each subunit default location separately, the following decision inputs are needed: For 65, three neighboring subunits are in the pixel above the subunit. This analysis must be done on the second stage analyzer to access the row above since it fed to the opposite side of the CCD array. Since 65 has five neighboring 22 light levels, it is assigned 22. However if there was an expanding other color group focused on default 65, one could program a series analysis as: If the row above has three subunits of another color and the next row away has five subunits all triangulating to focus on default point, then allow the point to be formed by assigning the default the other light level.

Default 66 has seven subunits defined and a default neighbor. Since these are all 22, it is as well. With that default complete, default 67 has a full ring of eight subunits at light level 22 so is assigned that level. Default 68 is up to the reader to determine. One could get around these decisions if all the functioning points are the same color by just assigning the pixel a single color ignoring any possible deviations in the default locations.

With three color levels being combined, the filling in of default colors from the color matching as is done to code color levels and refer to them by binary chains defining 256 color levels per RGB colors allows a default in one color which has matching color levels to a coded color to be assigned that color with high level of confidence.

Further image processing is shown in area 7 where the monochrome pixel light level is passed off to the low resolution signal to the right and the majority light level "22" having 16 of the 25 subunits that color after default analysis. This makes up the NTSC Standard Display signal as described in the General Description above.

The high resolution signal continues down the page with the arrays shown in area 8. Here signals of full definition for pixels with detail and one color signals for the monochrome pixel are given as shown in 80 and 81 respectively.

Who considering a field of pixels in the second stage processor, then tee same reduction applied to the high definition signal applies in another round allowing the assignment of one light level for 625 subunits. These subunits in a screen paint can be analyzed and assign a single color for 15,625 subunits, then again for 390,625 and again to 9,765,625 for a monochrome screen.

Area 9 illustrates the possible distribution of the various color blocks with defined subunits in pixels like 91, pixels of one color level in 92, and 625 subunit regions, or 25 pixel regions represented by 93. The distribution of these blocks like 93 can be throughout the image as shown in area 9. The right hand side of area 9 shows the array of 22 light level pixels needed for reduction to the single light level for the large arrays.

Not illustrated here but discussed above is the situation with an RGB signal, tricolor. The second stage processor then receives the output from the three photodiode arrays with the constant color blocks distinguished from the pixels with color level variance. Further analysis of the signal for the RGB levels is done considering all three inputs as to determine monochrome pixels thus where in the monochrome system the photodiode can distinguish low and high resolution signals, in the color system, the second stage processor output includes that function after analysis of monochrome pixels in all three color registers before assigning it to the monochrome pixel category.

In practice, the photosensitive treatment for the photodiode segment should be peaked to center its sensitivity in the midband area of the light spectrum it is monitoring. In this way, an RGB, tricolor camera should have three different photodiode treatments, one peaking center band for each the red, green and blue color bands and placed appropriate to its sensitivity. This gives the best performance at each waveband. Similarly, a quartz optical system used for Ultraviolet system should have a dielectric doped photodiode array peaking in that waveband center as should the case be for infrared or X-ray wavelength region uses.

Data compression by referencing the colors by color block in the image allows an array of colors assigned to a color block and referenced by four selected colors per block in most cases. In large color areas as the curtains in a theatre, one can exceed the color variations limitation of four colors and have several block designations provided to that area.

Further compression is provided by sequential frame comparison and transmission or recording only new image signals is applied. This is commonly referred to as Delta Compression. To allow still frame coloration and mid range initiation of video streams as by tape or disc recording, all independent frames, where a new image is first presented, are marked so the color references can be reviewed before presenting the still frame or the video sequence. Recording and playback equipment will contain this feature in the image output processing matching the data reduction configurations herein described.

Binary markers appear in the signal chains as follows: A binary marker marks the pixels in the low resolution signal which have the majority color presented and are defined in the high definition signal in the augmentation-type dual band configuration. In the high definition signal of this type, one binary marker marks signal that was defined on an earlier frame, omitted by Delta Compression and another signal marks the independent frame.

Collapsing the signal further through processing the low resolution signal, a second binary marker marks its signal voids cut by Delta Compression and outlines color blocks of larger proportion.

The resultant signal can be condensed into a single 6 MHz broadcast and recording band if one allows an extended scan rate on busy independent images perhaps showing first frame in the sequence at as defined a resolution as the band capacity allows and complete the detail in the next frame(s) until it is complete. Delta Compression buys space in sequential frames to readily complete color block definitions quickly.

Figure 8A:
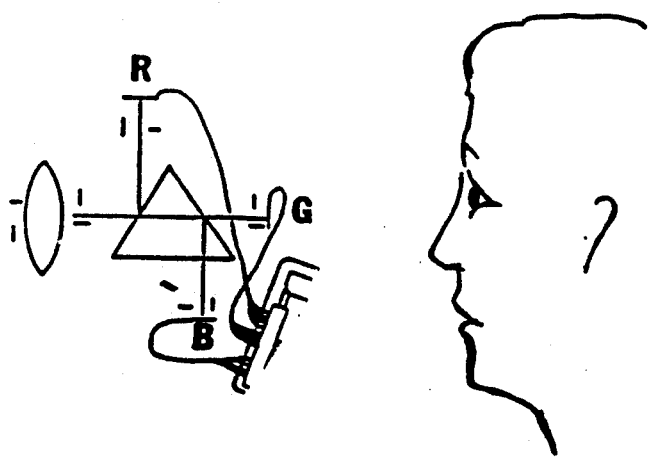
FIG. 8 is a drawing showing the segmentation of the chip for multiple simultaneous signal output accommodating more area in less time than with single output CCD components.
Figure 8B:
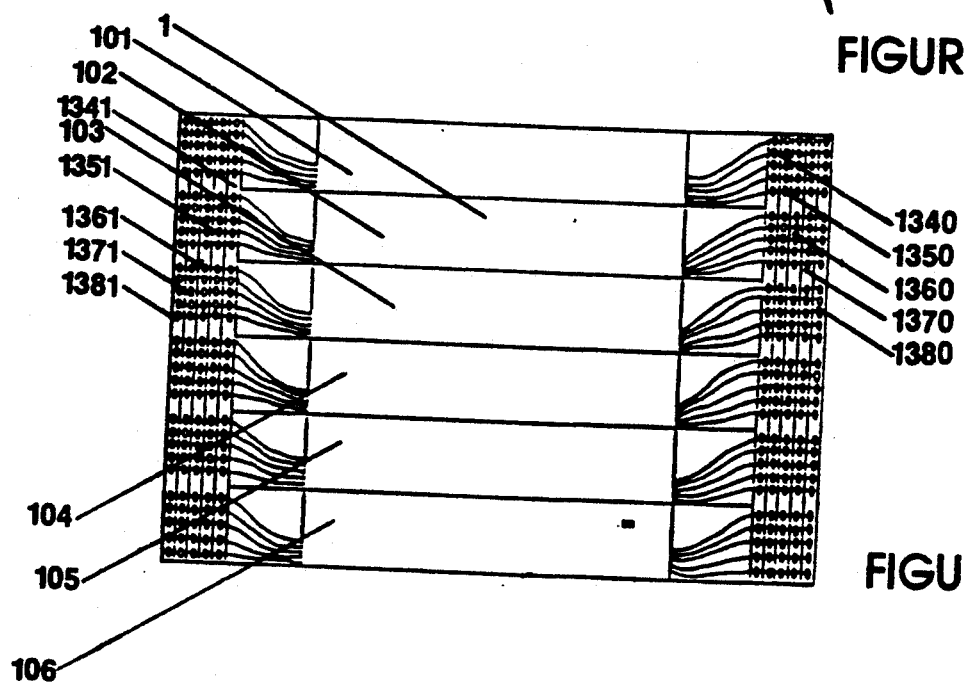
Figure 8C:
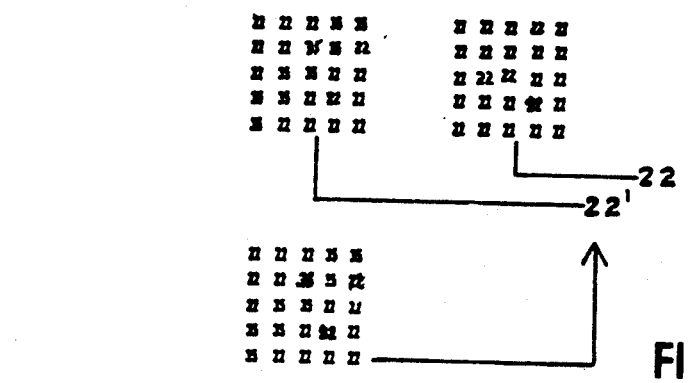

These photodiode array chips can be segmented in such a way as to allow regionalization of the chip as shown in FIG. 8. This way each region can fire independently providing a shorter span of time to poll the light levels throughout the image field. It can be regionalized in such a manner to serve one row of display units per region feeding in the rows included in each separately. In the proposed design, 105 rows of five photodiode units would define the full scanning per region and there would be six regions per chip. Each region would have independent leads, thus the number of data pins would be increased by a factor of six. It would speed the scanning time. With 900 pixels in a row, for each layer of rails discharging in the CCD layers, longer light collecting time can be applied thus improving signal clarity. Comparison of light levels between regions insures that the common colors between them are presented at the same RGB intensities for each color. The number of calibration points in the image perimeter should be expanded allowing each image region to have the five references like prescribed for display calibration.

Fabrication processes possibly employed in producing this chip includes the following:

The matrix layer 4 for an array of chips made at once should consist of separate blocks for each photodiode 4 spaced a fair distance apart. Alignment pins 45 are placed at corners, junctions between three of four units and at the outer corners where two meet and at the outer corners of the array. The pattern is repeated where alignment locations are placed throughout the process. An alignment circuit 460 as shown in FIG. 5 is built to include as the lower conductive point the ends of these pins 45. An upper layer of the alignment device 461 is placed over the array as each layer is aligned.

Building the circuit in layers is illustrated in FIG. 4. Three layers of mylar-type thin film-sheets 380, 330, 3309 are used at one time. The lower sheet 380 contains evaporative circuitry as transistors 3080 with target contacts encircling the vertical lead locations 33. The transistor 3 containing the proper substrates as spot silicon with proper doping and conductive leads creating the wiring, and continuing to the vertical lead positions 33. To this is added two layers of thin film 330, 3309. Then the mask is applied with voids at appropriate corner alignment areas and at vertical wiring locations at the proper diameter opening for the lead creation by evaporation or sputtering of conductive material 323. This step is repeated for layers for 370, 360, 350, and 340 as well as 21 and 22.

A power controlled, short wavelength laser beam or parallel beam X-ray beam destructs the thin film material at the hole positions through the three layers of film at size and locations of mask voids. The three layers are then placed on the matrix 4 with adhesive bonding 41 and gold or other conductive material 323 is evaporated or sputtered onto the upper surface 3309 which has exposed the top perforated layer 33. On completion of this, the top layer of film is removed, residual conductive substrate 323 is recovered for reuse and the film 3309 kept on file for reference or disposed of. The remaining two layers contain the circuit 380 and an insulating layer 330 with vertical conductive wiring 33 and alignment posts 45 and evaporant extensions 458.

The next layer of three films 3309, 330, 370 is added with alignment checks until the full array is aligned throughout, if multiple chips are being produced. Conductive material 323 is evaporated or sputtered as before described. This process is carried out for each layer required to complete the chip circuit base.

The final layer, the photodiode arrays 1, is placed on a dual wire voltage supply circuit with a power 12 and ground lead 11 positioned so as to serve two neighboring rows of photodiodes in the array as shown in FIG. 6. One row has two ground leads and three power leads 1110, the next has three ground leads and two power leads 1111. These wires 11, 12 covering the intersections of the rows plus the gate lead conductor 13 centered in the photodiode 10 positions are exposed circuitry. Great care is taken to insure that the gate position is flush with the surface of the power leads so the photodiode cubes set flatly across the lead and gate surfaces. Most vertical wire surfaces should be concave, bowling downward. One thin film stencil 330, 230, 130 is used which is removed after the evaporation or sputtering and the residual conductive substrate 323 is recovered and film 3309, 2309, 1309 disposed of.

Preparation of the silicon or other basal substance cubes from which the photodiodes 1 are created includes taking a sheet of the basal substance, doping it with the substance to determine its peak wavelength efficiency centering in the waveband desired 10 and adhering it to a carrier 16 with an adhesive 14 which will dissolve with a solvent 15 not affecting other adhesives 41 used elsewhere in the photodiode array. The carrier 16 is of a material which resists the cutting means chosen as tantalum with Xray or electron beam cutting or low wavelength laser beam. The mask is provided protecting the photodiode areas 10 allowing, in the planned design before described, 0.25 micron troughs 19 between cubes on all four sides. Also, dielectric material is retained at the alignment positions 459 and connects two neighboring alignment positions 458, 4501 so a circuit can be completed through the neighboring alignment posts and the dielectric treated silicon again lighting the LED 4502 for each circuit that is complete. Mask materials preventing disturbance of the substrate include tantalum, titanium and other heavy metals.

Once cut completely through to the tantalum carrier 16 throughout the area, the carrier and dielectric cubes 1 are set, dielectric side 10 down, against the sandwich of layers of the circuit base 3, 2, 13. Alignment of the two components is done by placing electrodes 459 on neighboring lower conductive alignment points 458 and determining circuit integrity at each pair of alignment points in the array of photodiode units being made in the batch.

An atmosphere of solvent 15 which dissolves the adhesive holding the dielectric surfaces 10 to the carrier 16 draws the adhesive material 14 either by gravity or by centrifugal motion into the between photodiode unit spaces 19 adhering the cubes 1 in place on the circuit base 13 while the carrier layer 16 is held in place so as to insure that the adhesive 14 has transferred and, on changing the atmosphere to an inert gas or vacuum condition, the solvent 15 is evaporated sticking the photodiode units 1 in place. Then the carrier 16 is removed.

Last, as shown in FIG. 6E, 6F, if power is required to be provided to the photodiode at the dielectric surface 10 or for whatever reasons power is applied other than at the base of the chip, one more thin film 18 treatment is made. The mask cuts holes for alignment positions 45 and slits at between photodiode locations over the power lead 12 such that the area penetrated by evaporant or sputter material 323 is shorter than the crosswise length of the cubic photodiode. It is aligned testing conductivity of the alignment posts and the dielectric photodiode matrix 459 for the photodiode layer. Once in place, hot substrate 323 is evaporated or sputtered which destructs the adhesive 14 in the power row locations to insure conductivity between the power lead 12 exposed in the trough 19 and also making contact on the dielectric surface 10. In this case the power lead wire 12 perhaps should be within the 0.25 microns width so as not to contact the base of the photodiode cube.

To create a matrix of these photodiode arrays or other such circuit component as showing in FIG. 7, the base matrix 4 is provided on a unit basis leaving a gap between neighboring chips on the holding surface 460 which bears, as previously described, conductive pins 45 to match the alignment pattern used in the stenciling processes. The adhesive 41 used to hold these in place can be mechanical or chemical such that the removal process here does not disturb the adhesive 14 holding the photodiode cubes in place.

Alignment pins 45 are vertical conductive posts rising between the base components 4 to their height. The base 460 is wired to allow each post position to be polled separately as to its conductivity with the upper alignment circuit component 461 in place. Recall that as the layers are added, the posts grow as the evaporated or sputtered conductive substrates 458 are added. The circuit on the base 4 also must allow the neighboring pins the create a circuit when the last layer 459, that of the photodiodes 1 is added.

As shown in FIG. 7, on completion of the layering process and at the time to separate components, the film layers extending between base units are cut at equal distance between the two circuits exposing sections of the printed circuits which bear the completed wiring diagrams for each component layer 1220/1221, 1221/1220, 1341/1340, 1351/1350, 1361/1360, 1371/1370, 1381/1380 and power layer 1110/1111 included. These are designed to have specific pin or printed circuit positions carry the signal or power or ground. A frame or the secondary processing chip connecting with these circuit points is carefully applied to the completed chip and circuit integrity is checked for each system included.

The corners of the films containing the alignment vertical wires 45 are clipped from the film before the circuit pin framing is applied to prevent any spurious conductive activity caused by these substrates touching any other area. This substance 323 can also be recovered, especially if the cutting of these units one from another is done again by laser separation with a mask providing the rectangle with 45 degree corners clipped.

In FIG. 8, the layers of signal output 1341/1340, 1351/1350, 1361/1360, 1371/1370, 1381/1380 shows the Charge Couple Device CCD output with five leads spews out the 25 unit pixel data bursts hereshown for six simultaneously functioning photodiode array processing units from array segments 101, 102, 103, 104, 105 and 106. Addressing any pixel gives array segment and line number as for segment 106, 106000–106104 and pixel series unit 000–899 thus addressing the two pixels defined as 106039/875–876. The data outputs spews at both sides having every other row go each direction, thus the even numbered rows go to one side and the odd numbered ones to the other.

A second means to prepare layer 1, the photodiode chips, a matrix of silicon square rods, is to take plates of the silicon the thickness of the cross section of the rod and form a laminate with alternating silicon plates and 0.25 um insulator material in vacuum to prevent bubbles with a dusting of heat sensitive adhesive. Bake to seal under pressure to maintain dimensional requirements. Cut the laminate in slices the cross section of the photodiode chip plus the 0.25 um across the laminate layers. The keeping the laminate layers going in the same direction, laminate these with alternating insulating film and conductive foil as goid at the 0.15 um thickness with conductive adhesive on the gold foil and non-conductive adhesive on the insulator, again with heat sensitive adhesive. Press to dimension and bake to set adhesives.

Slicing across the laminate layers gives slices containing the photodiode squares with the conductive dividers in place to stand over the positive voltage wires. The outer surface of the photodiode chip arrays are then doped or coated with dielectric appropriate for color band which is in electrical contact with conductive foil and the voltage source on the chip base when mounted.

To set in place this photodiode array on level 2, if there is a continuation of the vertical wiring for two rows and two columns, with a microscope, a technician can place the photodiode array such that the added rows and columns of vertical wiring points are exposed on an equal spacing thus aligning the photodiodes over the matrix of vertical wiring to contact each photodiode as well as centering the power and ground leads on the conductive and insulating laminate layers forming the mortar for the photodiode blocks. This array is covered by a teflon film and pressed and heated to allow adhesive to flow down and adhere the layer 1 to layer 2. If one needs to centrifuge this to insure adhesive transfer, that should be done. This seems the easier method.

FIG. 8A shows a sketch of the color camera showing three photodiodes, one for red R, one for green G, and one for blue 8. The pixel numbers are the same for each photodiode and that way the address gives three color levels defined by the color numbers 22 and 35, which in the single photodiode array give a monochrome signal representing only the overall intensity of light.

The Second Stage Processor takes the output from the photodiode array as shown in FIG. 8 and converts the output stream to highly compressed, recordable and broadcastable video signal combined where needed with audio, data and other communication elements. The specific output is determined by the application.

To key the discussion, segments of the DARPA 90.100 proposal submitted Jul. 2, 1990 are included as presented:

c. Identification and significance of the Problem or Opportunity

The current means of handling Charge Coupling Device (CCD) output is scrapped and the question asked, "what are characteristics of images being processed?" I find:

1. Any image has distinct color regions with common variation.
2. Many flat color regions exist—blue sky being one.
3. Little frame by frame differences occur in normal circumstances. In strafing, screaming jets, sequential images have a front to back progression of image.
4. Audio has varying roles and in some cases is not used or only overvoice or conversation monitoring is desired.
5. Depth perception in some applications is a major factor.

6. Surveying, surveillance can be an Unmanned Air Vehicle (UAV) task and resolution far beyond even E3TV is desired.
7. Frame rates are determined by rasterscan speed.
8. If one does a two stage image data development scheme, considerable compression of signal can be achieved.

The task in Phase I is to show how it is feasible to achieve #8 based on applications of points 1-7.

d. Phase I Technical Objectives

1. Demonstrate NTSC (current US FCC Television Broadcast Standard) compatible augmentation-type signal supporting 2625 lines, 3500 crosspoints for E3TV system recordable and broadcastable on dual 6 MHz signal bands.
2. Cycle low resolution NTSC component through data compression used for high definition band by incorporating color coding, defining 5×5 squares of pixels as to monochrome or detailed, and using Delta Compression on repeat coloration patterns.
3. Determine band packing for the signal resulting from 1 and 2.
4. Prepare for audio compression where desired and determine band width for:
   a. analog audio.
   b. digital audio as developed by David McFarling in the Interactive Video Industry Association (IVIA) Standards work accepted by the US Department of Defense (DoD).
   c. voice only recording using speech coding defined in DuBrucq patent U.S. Pat. No. 4,520,501 and pending 1987 filing digitally coding sounds and pitch for voice playback of any verbal language. This applies in overvoice, transmission recording, surveillance work.

e. Phase I Ark Plan

The specific objectives given in Section d above are discussed one at a time giving what is planned, its schedule of major events, technical detail and methods employed.

TO-I. Demonstrate NT5C (current US FCC Television Broadcast standard) compatible augmentation-type signal supporting 2625 lines, 3500 crosspoints for E3TV system recordable and broadcastable on dual 6 MHz signal bands.

Here we manipulate CCD output as follows:
a. Lay in memory five neighboring scan lines.
b. Review five pixel width segments of five line band to determine if square is monochrome or detailed. If monochrome it is carried on NTSC band. If detailed the majority color and a binary marker are on NTSC band and it is defined on second band.
c. Code color blocks numbering color levels within the block and identify blocks.
d. Apply color coding to second band definition.
e. Delta compress by comparing previous frame with current frame and only include color changes in sequential frame signal.
f. Pack second band data in 32 bit words and transmit with the NTSC Signal increasing resolution by a factor of 25.

Technical Detail

Packing the signal bands requires inclusion of one binary stream in the NTSC band indicating with "0" monochrome pixels and with "I" majority color of detailed pixels. This band is carried in analog mode for broadcasting and can be recorded and otherwise transmitted in the digital mode.

The second band has two binary bands: one marks new pixel detail with "I" and repeat pixels with "0" here not being defined; and the second marks the independent frames where all colors are defined. Still frame displaying scans start at this marker to fully define colors for the selected image.

If 256 color levels are desired per red, green and blue (RGB) signal, eight bits are required per color. These can be sequenced along the pixels and titled with color block code and identification number. Several blocks can be defined in four color arrays as: 1234 1234 1234 *abcd ABCD abcd ABCD abcd ABCD efgh* . . . and [ital.] 1234 1234 1234 1234 1234 *abcd* . . .

So far two bits are used for binary markers and eight bits for color definition in four pixel sequences. If four color levels are used, ten pixellettes (1/25th of a pixel in 5×5 arrays per pixel) are defined in the first word and with two word pixels, 15 pixellettes are defined in the second word. Two bits remain unassigned in each word.

Independent frames, where all color blocks need definition, may have four word blocks defining each new color block with four color inclusions dispersed amongst the pixels scans. The use of the two remaining bits would code the onset of color definition.

Scan line end markers and other details directing the electron bed including the overscan lines for calibration described in the AlignmenC and Calibration for camera and display add to word purposlng markings decisions.

In practice, the second band readout is tagged to NTSC band binary markers. Digital checking insures that the majority color on NTSC Band matches one of four colors included in the defined pixel.

TO-2. cycle low resolution NT5C component through data compression used for high definition band by incorporating color coding, defining 5×5 squares of pixels as to monochrome or detailed, and using Delta compression on repeat coloration patterns.

This gives a digital signal only.

Here we create a third level of data for image presentation. It is 1/25th the resolution of the NTSC band and is created by driving the resulting NTSC signal information through the a-f operations given in TO-2 above. This third level is 105 lines by 140 crosspoints. It reduces the data for monochrome areas by a factor of 625. Here we paint by square, visible tiles.

In this level, the color blocks are referencing the color code definitions and covers the areas marked "0" in the binary code. The revised NTSC level, the second level in this discussion, defines the pixels varying in the 25-pacs defined in the third level and drops the requirement to carry majority color information only needing the binary signal to call up "first level" signal definition.

Let me pattern what we have achieved:

```
••••••••••••••••••••••••••1111111111122222211111000000011121200
••••••••••••••••••••••••••1111111111122222211111000000111221120
••••••••••••••••••••••••••1111111111122222211111000001112222112
••••••••••••••••••••••••••1111111111122222211111000000112222211
••••••••••••••••••••••••••1111111111122222211111000000001222221
••••••••••••••••••••••••••1111122222222222211111000000001122222
••••••••••••••••••••••••••1111122222222222211111000000011121200
••••••••••••••••••••••••••1111122222222222211111000000111221120
••••••••••••••••••••••••••1111122222222222211111000001112222112
••••••••••••••••••••••••••1111122222222222211111000000112222211
••••••••••••••••••••••••••1111122222222222211111000000001222221
```

-continued
```
****   *****************    **1111122222222221111100000001122222
****   ****************    **1111122222222221111100000011121200
****   *********|*********  **1111122222222221111100000111221120
****   ****************    **1111122222222221111100000111222112
****   ****************    **11111222222222211111000001122222211    5
****   ****************    **1111122222222221111100000011222221
****   ****************    **1111122222222221111100000001122222
****   ****************    **1111122222222221111100000011121200
****   ****************    **1111122222222221111100000111221120
****   ****************    **1111111112222221111100000111222112
****   ****************    ~*1111111112222221111100000111222211   10
i x************       1111111112222221111100000011222221
_*** *****************     **k1111111112222221111100000001122222
**** *****************      **1111111112222221111100000011121200
```

If this page is laid on the table and one views it so that the area defined in the pattern is square, one can easily review the effects of the three levels of signal proposed.

The pattern shows in non-square format from left to right:
  the third level signal defining 625 pixellettes in one tricolor definition using the coded colors;
  the second level signal defining 25 pixelletes in one tricolor definition 'using the coded colors' and
  the first level signal defining each pixellette by tricolor code definition of each point.

Considering the far right definition, the detail capability of the entire picture is represented by this. Very few images use this detail level. However, landscapes are one of the few and these are most frequently what is viewed in land surveying and strafing, screaming jet passages.

A second type of imaging calls for current frame detail only showing only new color patterns. This shows movement in observations as would be the case of a sitting tank waiting for enemy movement. The viewer must distinguish wind blown vegetation from animals from troop movements or oncoming rockets which can be distinguished by location in image, color and other factors. Rapid alternating between normal image and this motion viewing means allows the viewer to make able decisions in identifying moving objects.

TO-3. Determine band packing for the signal resulting from 1, 2.

The NTSC compatible signal described in TO-I is centered on the NTSC band having the high definition slave to it. Systems of the Augmentation-type FCC Chairman Alfred Sikes has stated would not qualify for consideration for the next US Standard. If the TO-2 work is successful, a single signal band of 6 MHz could carry this video definition plus an audio band, we can enter the Television Standards Race if the system is up and running by January, 1992.

This third level addition may give sufficient data reduction to make fit the signal in the 6 MHz bandwidth in the majority of cases. Some overcapacity can be compensated for in sequential frames so little performance is lost in the data crunch for home viewing. These techniques would need careful refining for the strafing, screaming jet ground view imaging.

Until this is tried we cannot predict what the data load will be.

The most important factors to determine in any video application is the degree of repeat pixels between sequential frames so as to determine the band capacity requirements. From this information we Ban determine the bandwidth requirements for the application. Chips designed for military, government and industrial applications must allow expansion and contraction of bandwidth to allow appropriate broadcast bandwidths for the task.

For the strafing, screaming jets ground surveillance monitoring, one may want to try to configure a fixed rate of passage of image components by frame. This algorithm may save memory and it can have the groundspeed indicator and radio altimeter in the plane tied to the image processor for calculating image displacement.

Discussion of problems encountered mentions the compensation factors in polling the 'CCD at varying rates to have full color definition over a range of light levels. Having a two stage processor for the image allows laying the image out and then scanning it at the transmission frequency. If the dark scene viewed requires 15 Hz CCD responses, then the same image is scanned four times at 60~z for transmission. If the light level saturates the camera, the CCD response rate can be increased. This would help focus the streaking in our strafing jet giving less traversing of the imaged area during exposure. However, if the CCD creates an image at 120 Hz, only half of the images would be transmitted at a 60 Hz transmission cycle rate.

For restricted access, consideration of packaging of the signal on two bands for which both are required to receive any picture. Wavelengths of the transmission can change at intervals protecting the operation from transmission interception and jamming.

TO-4. Prepare for audio compression where desired and determine band width

Where desired? In Unmanned Air Vehicles, audio use may include recording transmissions of the "pilot" to comply with air traffic control requirements, in dirigible applications recording a speaker addressing a crowd, or one needs to determine by sound where certain events are occurring, and in training, an overvoice describes and instructs students viewing the event or controlling the simulated craft.

The strafing, screaming jet wanting minimal broadcast band width, uses only video signal. A dual signal which only works when both are received may be desired over a single broader radio signal.
  a. analog audio. Commercial applications here may give some demand as music events needing 8 track or Dolby sound.
  b. digital audio. Developed by David McFarling in the Interactive Video Industry Association (IVIA) Standards work accepted by the US Department of Defense (DoD).

This is used for training and communications for Defense applications and throughout the Office Equipment field including computer, video and telecommunications. David McFarling has completed the development of digital audio supported by the Department of Defense and the Aviation Industry CBT Committee. Here he must configure the signal band requirements into the bandwidth constrictions where audio is desired. Some Phase I time applies to the inclusion of Digital Audio in the Digital Video signal bandwidth.
  c. voice only recording using speech coding defined in DuBrucq patent U.S. Pat. No. 4,520,501 and pending 1987 filing digitally coding sounds and pitch for voice playback of any verbal language. This applies in overvoice, transmission recording, surveillance work.

In contrast to the digitized speech for speak to spell applications, the above speech coding allows greatly reduced data capacity for recording on a playback basis speech of any verbal language. The key reason for its inclusion is the very compact signal required where only voice information is recorded. It includes the grunts and groans which may not be indicated in speak to spell as well as the mix of languages spoken which may confuse a single language speak to spell system. Where one must preserve gobs of discourse in a restricted memory bank and have it indexable for audio review, the coded speech is applicable.

Sounds are common among languages. We anticipate about 56 sounds to categorize into recognizable sound discrimination areas to cover all languages. The code takes eleven bits to introduce a new sound and a three bit carrier for pitch. During silence, no bit capacity is used. Phoneme coding during speech time configurations has long breaks between sequential sounds.

SECOND STAGE DEVELOPMENT

To provide the video data compression functions in the hardware or firmware levels provides the fastest processing with the least external dependence to create the final broadcast and recording signals. Because some applications require an augmentive type signal supporting a lower resolution signal and building on it to create the high resolution in areas of detail, other applications require one broad band signal including audio and other communication factors referred to as a simulcast-type signal, and yet other applications may want the signal carried on narrow band, even rotating broadcast bands, dual band signal containment.

From this we realize that the second stage unit must either be broadcast configuration specific or have a conversion switch that selects the type output from the optical system.

For color versions, RGB, the second stage processor for each color can be built onto the photodiode array described previously and a third unit combining the half processed signal from the three array second stage processors finishes the image data compression. This third stage processor is discussed in expansion of the monochrome processor functions.

The second stage processor has twelve tracks of 25 unit signals incoming from the six segment, interlaced photodiode array.

The 25 voltage levels are determined on analog-digital converters giving 256 levels of intensity contained in an 8-bit readout.

The tolerance for identical level is preset as per the application and light and motion conditions. If the color levels for all 25 points exclusive of defaults is identical within the set tolerances, the whole output for that pixel is the one color. If not the 8-bit output is provided in matrix for the 25 points. If the intensity levels vary, for the monochrome camera the majority intensity can be provided to the standard signal with binary marker. For the RGB Color Camera, the 25 points are combined with those from the other two color outputs in the third level processor along with monochrome pixel intensity levels. If all three colors, RGB, have monochrome intensity levels, that tricolor output is applied to the NTSC Signal for augmentive-type signal and NTSC applications; and is combined with 24 other pixels in a square for further collapsing of data if all 25 pixels are the same color, continuing this process as long as 25 areas have the same color. This is limited to the point where two matrices of the same color cover the entire screen.

In the second stage processor for the monochrome system and the third stage processor in the RGB color system, a data field is established which holds all of the pixels. It is colored in by the initial image and a binary marker indicating an independent frame is included in the output signal. A color coding bank through which the data enters the data field codes the color block variations and codes the specific blocks. Data held in the field is coded by color block and variation within containing in the monochrome situation a two section multi-bit code rather than the 8-bit signal. For the RGB system, it contains the same multi-bit code rather than the three 8-bit signal components.

Here the defaults are located and intensity levels/color levels are inserted according to the formulae described in the FIG. 3 discussion. In the instance of color arrays, if any one of the three signals has detail for a pixel with one or more defaults, then the pixel with variation formulae apply, not the full pixel color as for monochrome outputs. With 256 color levels, this is not a common situation.

The data field has an input side which is fed by the Second Stage Processor signal and an output side which takes the fully defined components, data blocks of all sizes making up the picture, and distributes the signal to display, record, and broadcast modes. With SuperCCD array scanning somewhat dependent on light level, the image is changed per scan output from the photodiode arrays inputting this data field. The output from the data field is regularly scanned for output at 60 Hz, 30 Hz or whatever the selected frame rate is. In dark environment videotography, it may take a 15 Hz scan rate to have enough intensity difference to make an acceptable picture. The output from the data field would be scanned four times, at 60 Hz, and treated as one independent frame followed by dependent frame signal which would Delta Compress out to nothing.

In the established bandwidth signal band, if the details defined in the above independent frame overrun the capacity of the bandwidth signal, the frame details are completed in the next frame transmission when the signal from the following frame is reduced with Delta Compression as described next.

The dependent frame is any frame following the independent frame or prior dependent frame with less than 50% changes in color block and color block locations. The 50% is arbitrary, it can be set at 10% or 90% and the change can be one determined by the operator of the camera by setting the color bank capacity variance rate.

For independent frames, the data field has a third level where new details which fall through the image and the new features alone are scanned. The marker system cadencing new fields in the transmission scan place the new detail which alters the image in receiver or display processors. This is the Delta Compressor.

Any dependent frame still viewing or start of a motion sequence, players start the scan from the last independent frame and carry forward over the dependent frames prior to the target frame to collect the color coding details to properly display the image. Without this strafing of signal, only changes occurring between the just prior dependent frame and the target frame are viewable, and then without coded colors defined.

Details of the second and third stage circuits are described based on work of Demetri Psaltis of Caltech where intense arrays have processing at each receptor point. These processors are at the points of the 25 unit outputs into the system and again at the intensity block comparisons as the RGB signals pass into the data field here pulling color blocks and intrablock variations.

In the mosaic system with six segments to the optical photodiode array, interlaced signal output having dual feeds off the segments, twelve pacs of 25 units are accommodated in the processor. In developing signal from the data field, a pixel scan pattern can be linear, interlaced taking the five line five point (5×5) pixels in order back or forth the 630 times off the camera for the display; or it can be size edited to a 4:3, 2625 line output in five line groups scanning back or forth over 700 pixels 525 times giving the 3500×2625 output; or it can be size edited to a widescreen signal with 16:9, 2520 line output in 504 five line groups scanning back or forth over 896 pixels giving the 4480×2520 output. It also can be mosaiced taking simultaneous transmissions of several lines at time, as the photodiode array is segmented in this description.

The editing processor is repeated in the camera with autoset, in the editing equipment, and in recording equipment. The large signal is recorded on camera recorders while the edited signal is transmitted to other recorders or broadcast. It consists of start scan and stop scan commands and can be controlled with a joy stick or touchscreen with finger on the designated corner of the proper aspect frame selected.

For recording and creating graphics or for blended palette color editing, a three dimensional color wheel can be used where the intensity level is the "z" axis and the spectral wheel, a circle, occupies the "x-y" axis. On a computer display with a touch screen or touch screen and joy stick, the intensity scale can be adjusted by sliding the' finger up or down on the display margin and the shade selected by touch or joy stick drive within the circle of the color wheel. This allows full dimensional color of the pure hue through full grey scale mixing from black through grey to white. Selecting these hues can provide a substitute for the Red, Green and Blue centered colors making color balance and intensity balance variation in images as well in use in graphics creations. With color block coloring of the image, the color block variations are altered through the color processor to reflect the new color primaries. This change can be instigated from any selected independent frame.

From a binocular camera image processing requirement called for in the work with dual 1575×2100 or 2100×2100 displays for stereoscopic viewing, the data from a two camera system is edited down to a single frame of video packing one whole image plus two thirds of the second in the cross screen array and filling the bottom subframe units with the three or four 525 line segments of the second display. This proposal was for DARPA 90-085 category of Small Business Innovative Research in the 90.2 Defense Department publication.

For the DARPA 90-100 proposal, output of a scanning camera which is a linear array of photodiodes feeding continuous blocks of five data points which comprise the pixel. As 700, 896 or 900 pixels are complete, they are framed, or constitute a frame. The next frame follows and is displayed to the right of the first one and the next to its right. With a mosaic, mosaic display of 25 mosaic displays, five times the number of lines, as 2625 lines times five, or 13,125 line image is displayed with five sequential frames in each of the five lines of mosaic monitors giving a massive picture accumulated over time. Recording five frames simultaneously can be done by sequencing the lines on a single disc or multiple discs or multiple recording points can be used on a single disc. The last two, multiple discs or multiple recording points can give an ordered shift in the signal display for each frame. Special scanning to slowly scan across the five frames is not invented here. This technology has been observed prior to this patent preparation for single frame use. It can pan multiple images without much change in circuitry.

With the voltage absorption increases by the photodiodes with increasing light intensities, the black color is the highest voltage output. Listening to other video system developers at the FCC Advisory Working Party #1 meeting, I was shocked to hear one Japanese system developer reply that the hardest image to transmit was black. It is easy to understand here since, as the CCD output passes from one transistor position to the next, a bit of charge is left behind. Voltage compensation formulae can be added to the color block variation schemes considering the pixel location and direction it travels in the interlaced output giving compensation for loss to those pixels draining over the distance across the photodiode array. With the color block system, the block colors can be consistent throughout the whole image if the variation within the particular block variation is inclusive enough to take into account this voltage loss. With interlaced signal, a color to one side has a long and short scan in adjacent rows. The average voltage between divergent voltages should be used. In practice, to insure this is correct, center color levels should have identical voltage drops for light intensity. This SUPER-CCD System can overcome this "black field" difficulty.

Here the hardest field to display is t he constantly changing random color minute component array as one may get looking at a Vatican audience by air surveillance when the individuals are randomly jumping up and down and swaying and wearing all manner of head coverings. Another is the Indian dancers with wild motion wearing many colors of feathers, leather, textiles and having many sun through shade variations over the blend of textures, hair, skin and apparel.

SIGNAL CONSTRUCTION

Combining the data from the color block and variance coder output and the data field second and third levels, the display, recording and broadcast signal is built. It uses 32-bit words.

The color block definition uses the full 32-bit word for each color and is restricted from using "0-0" as the first two digits in the word since that is the key for pixel data.

Here is a color code word: 10 110101 10010011 11101100 10100101
                                   I         I        I        I
            Color block and variance code/ red blue green I
                                    I levels of intensity    I.

This is the code word format for the pixel signal. These include two words to defined the detailed pixel, one with color variance.

00 10110101 00 01 01 01 01 00 00 01 01 11
      00 00 00 00 01 11 10 00 00 00 11 00 00 00 11 11.

This shows a detailed pixel coloration pattern in the color block described above, with an added three more color intensity levels.

Defining the pixel using 0-3 to represent the colors, one gets:

| 0 | 1 | 1 | 1 | 1 | |
|---|---|---|---|---|---|
| 0 | 0 | 1 | 1 | 3 | |
| 0 | 0 | 0 | 1 | 3 | In the NTSC signal it would be |
| 2 | 0 | 0 | 0 | 3 | transmitted as "0" marker "1" |
| 0 | 0 | 0 | 3 | 3 | since "0" is the majority color. |

The two word per pixel signal has in the top line the two blank bits followed by an eight bit color block definition and ten 0-3 binary identifications of the colors included covering the first two lines of the pixel matrix. The second word contains the two blank bits followed by fifteen 0-3 binary identifications of the colors included for the last three lines of the pixel matrix.

The color block variance is also restricted from using "1-1" as the first two bits since that marks the monochrome pixel which has after that marker the eight bit color code for the color of the pixel. The remaining 22 bits in the word can provide the pixel block expansion were the further data compression applied where squares of 25 pixels are the same color, where squares of 25 of the squares of 25 pixels are the same color, and where squares of the squares of squares of 25 pixels are the same color. As the block takes considerable screen size, a second word coded starting "1-1-1" is used thus avoiding the "0-1" or "1-0" allowed for color block and variance coding.

The details above apply in defining in independent frames the entire image. The color block and variance output starts with the initial colors applying to the scan start and then are completed as they can be interspersed among the pixels using time intervals among the monochrome pixel fields.

For inclusion in the camera display field, the bandwidth is broadened so as to include in tandem on the same line, two words, one allowing simultaneous color block and variance definition and the other the pixel patterns. With the editing of this signal to that for either the 4:3 aspect, 3500×2625 line, output; or to the 16:9 aspect, 4480×2520 line, output, between scan and end line time intervals give place for the color block and variance words since the timing of the whole scan must be the same for the camera and the display.

The independent frame copied from the second data field level starts with the independent frame marker and the frame number taking one word. Frame number display is a callable signal in video tape and videodisc use. The independent frame would begin with a no signal space followed by the "I" as the first bit of the first word. The remaining 31 bits comprise the frame number.

In contrast, the dependent frame copied from the third data field level starts again with no signal and then with the dependent frame marker "0" and the frame number in the following 31 bits taking one word.

The independent frame data consists of total definition of the image at whatever level of data compression is provided prior to Delta Compression. This independent frame status is used for sequential still frames as would be provided from tape, videodisc or CD-V (Compact disk for video).

The dependent frame data consists of definition of parts of the image which changed from the just previous frame whether it is following the independent frame or another dependent frame. The data here has been Delta Compressed in that the changes in image for the new frame are presented in the image for data field second level and are provided "stand-alone" in the data field third level. Some new color block and variances are introduced. In the instance of watching a forest, an animal or bird may come into view, so these color-words are easily interspersed among the changed image definition points.

For a packed signal configuration as for a broadcast band of restricted bandwidth, the communication data, audio, captioning and other transmitted or recorded information can either be interspersed in the data with marked 32-bit words or words of lesser bits in the cadence of 32-bit words or can be fed from the other end of the spectrum to take up unused space if image data is packed together and dispersed at detailed pixel locations thus keyed by detailed pixel markers in the display image processor.

We just touched the other side of the bridge. The aforedescribed signal is recorded, broadcast and displayed. As one can deter-mine, an augmentive-type signal would include the standard signal of current time televisions as NTSC for the United States and PAL or SECAM for European systems with a slave signal defining the detail in pixels marked for containing further detail. Also, the standard signal can be provided and an independent simulcast signal can provide the fully compressed image with the 2625 or 2520 lines defined for Advanced Television Resolution Standards.

The raw camera signal of 3150 lines provides a closed circuit image that is recorded on special recorders to carry the full image and displayed on the 8×6 mosaic monitor displays which have a void on the sides of 400 points or 80 pixels on which editing notes, audio prompts and graphics can be stored for use by those preparing the video and audio mix with overgraphics which would comprise the advanced standard broadcast and recorded program or video segment. The trimmed final signal leaves the spaces at the ends of the lines for the 4:3 aspect output and at the top and/or bottom of the image for both the 4:3 and 16:9 aspect output for color definition.

This format is configured to fit within the 6 MHz bands used in current video, audio and data recording practices and can be configured to fit within other band structures as is required for specific applications or for a new standard practice for advanced video systems. This applies to both broadcasting and recording applications.

With production techniques defined for creating the photodiode array, and the second and third stage processors to create the signal, there is no reason to stop here. Using the same techniques, the display and receiver processors can be designed and produced. Since recorded signal is the same configuration as broadcast signal, these processors are the same. The receiver processor will have a broadcast band receiver precursor in the signal processing sequence where the display will not. The display relies on recorded or computer memory or computer generated signal only. A VCR type unit with a receiver may provide this entry of signal for a display unit sending the received signal directly to the display image processor.

There are two types of image processors. The first is that which accommodates the herediscussed resolution levels. The second accommodates lesser levels of resolution. The first uses all video data, the second does a proportional cut in detail per pixel which affects the detailed pixel imaging only. The following shows data reduction configuration for square pixel systems:

Patterns are shown with number ~s and portion of image for NTSC for accommodating other displays or proportional viewing on a mosaic display as illustrated in FIG. 5:

```
T H O 0    H T H . O H T . O . H
T H H 0 H  T H . 0 H         H . O
T T H 0 0         T . H . O           H
T T T H 0  T T . H 0         T . H
T T T T H  T T . T H T . T . H

5/5        415     1575    3/5    2/5    1/5
```

For systems with non-square pixels, a cross pattern can be as shown in the 3/5 version and a line pattern as in 4/5. Where the ratios do not come out exact, alternating bands of one ratio can be used with the correct portion of another. Say the 3/5 version leaves the system a bit short of full field, then at regular intervals the 4/5 signal is included one pixel at a time. This does a very mild distortion of the image giving one row of pixels 1/5 more coverage than others at the interval of these broader pixel locations.

In the case of the monochrome pixel, marked and with the majority color, the lead color would be "T" not "H". But in the system with non square pixels using 3/5 by 1/5, the actual pixel unit color is used. Here with the one row, these colors are defined in this pattern: T . H . O or vertically:

```
    0
    H
    T .
```

Other than these data handling changes the image processors for the full image and those with reduced image operate the same.

The incoming image is presented on the data fields with the independent frames filling in the second level and with dependent frames interspersed in the third level. The color block and variance definitions is received by the color or intensity processor which is upstream of the data field enroute to the electron gun arrays. The audio and other data go to processors specific for those items.

In sequence for one frame we have the third level data input to the second level of the data field giving the updated image in the case that this is a dependent frame. Independent frames work starting a the second level.

In this processor, the first level of the data field is designed for data output to match the characteristics of the display or receiver design. In the case that it feeds a 5×5 mosaic monitor matrix for 4:3 aspect screens, each of the 25 regions for each unit in the mosaic has its own data lines in the pattern needed for the monitor unit. If it is an interlaced display with back and forth rasterscanning, then two leads of five wires leaves this area carrying in one lead the left to right scan data and in the other the right to left scan data. The direction reverses the order of pixel definition for these rows. If it is another scan configuration, then the number of leads and sequence of data varies to fit these requirements.

Similarly, for the widescreen display, were a 7×5 mosaic monitor being served, the first level data field would accommodate this array with lead numbers and direction of data flow appropriate. If the monitor unit has the expanded crosspoints and reduction in rows proportional to this display, 896×504, then the first level data field would accommodate a 5×5 mosaic monitor array at the proper lead numbers and direction of data flow.

As the signal moves to the electron guns, it is processed in the color or intensity, for black and white systems, the coded color blocks and color variance are converted to carry as either digital or analog signal, the actual intensity level(s) required. The RGB color system signal which originates with five data streams is expanded to fifteen data streams having one lead per color, red, green and blue.

In the process of creating the color levels, somewhere either in the camera or in the receiver, the voltage input which is highest for the black, non light signals must be inverted to provide the highest electrical differential for the white, bright light signals. With this the brighter the pixel or detailed units in the pixel, the higher the voltage to the particular electron gun as its electron stream activates the phosphor at the appropriate address in the image.

Thus, in summary, the DIP, Display Image Processor; the RIP, Receiver Image Processor; and the PIP, Proportional Image Processor have:

1. the data field providing processing on incoming video signal creating the full image to be displayed in memory with dependent frame input adjusting independent frame and progressed independent frame images.
2. the color block and variance input providing:
   a. for monochrome systems the intensity levels represented by the code in inverse voltage levels to make white a higher voltage than black.
   b. for color systems, the branching of the signal to give intensity levels for the three colors, red, green and blue, in, again, inverse voltage levels to make the brighter color the higher voltage and the duller and darker colors lower. Here, for each one wire entering, three wires proceed to the electron gun array.
3. the electron gun array which receives for each gun, one wire, and the timing of the signal input with the rasterscan control puts the color levels into the right sieve hole to create the right color in every unit of every pixel in the whole display.

The number of electron gun arrays is identical to the number of monitor units. The number of electron guns in an array is proportional to the number of wires coming from the color block and variance processor and the wires address the appropriate gun for application of the right intensity levels for the color phosphor to be excited in the right row over the right image field.

The PIP, Proportional Image Processor, will have the output from the data field with the proper number of leads for the number of electron guns in the display or receiver unit, for whatever interlace or non-interlace characteristics it has and properly wired for correct color phosphor excitation.

The data transference for the RIP and DIP processors for this type of video as described in this document, the interface system used will provide in proper sequence and starting at the right point on the image, first a line going left to right, then the next line on the interface going right to left, then the next line down going left to right, and the next line down on the interface output. Five lines of data represent the five lines per pixel and the five units across are provided by packets of five data points on each of these lines. Because in the electron gun output, each color unit is included in the scan, the completed data field for that monitor unit pours through the electron guns to create that part of the image that the electron guns serve. The data field contains all data points and in the divisions between the monitor do not loose one pixel unit data point.

Recall in the display description, that the electrons are pulled from the gun, through the sieve to the phosphor rows by the charge applied across the rows of monitor units for the specific pixel row scanned. Thus all of the rows of monitors must by in sync A-th their signal provision all feeding their specific row number[~ at the same time. Thus for all five rows of monitor units, all begin scanning row "I" at the same time. The end of the row and beginning or the row data must be provided at these crosspoints to have the images of the specific monitors be continuous. Calibration signal is provided in overscans FIG. 6 as was described keeping the width of the row per monitor correctly expanded. The 30% white light flashes feed the extra-line pixel units which fill the fiberoptic detectors placed in the between monitor structures as the next pixel hole in the sieve for five pixel unit columns at top, middle, and bottom rows. This with adjustments made to insure full five unit illumination for each location, keeps the full monitor image complete, in correct register both up and down and across to properly meet up with the images in the neighboring monitors on all sides of the monitor.

With the color block and variance output being the same for each monitor unit, the created voltage level for these calibration pixels representing 30% white light allows the full display system to check the electron gun performance expecting the color levels of the calibration for each color, red, green and blue, to have the same intensity levels for each monitor and on all areas within the calibration system for each monitor as determined by the photodiodes for each color for each calibration fiber of each monitor. Proportional adjustment of the voltage for electron guns between monitors, and during a scan if the electron gun output differs with position in the scan field must be provided. Filters can be inserted in the circuitry to carry these functions.

The colors of light in the calibration points are provided by having three optical fibers with the phosphor for each color applied to the end of the optical fiber placed where the electron gun it is to be excited by scans. Thus the placement of these fibers after color-specific phosphor is applied, must match the color-specific phosphor of the screen inner layer. Also, the proper charge matching that of the screen row must be applied to the optical fiber end to insure electrons impact the phosphor. With this accomplished, the 30% white light signal is reaching the proper receiver position for the calibration.

Accommodation of graphics overlays on video imaging is done through feeding the graphics patterns to the third data field level and have it then integrate into the video image. To best allow removal, a fade away color would cancel and a default mode could recolor the video. The other means would be to repeat copy the independent frame so the first image of the scene is complete and then insert the video overlay before the first dependent frame. If the image is to be over a moving video sequence, one can automate a resetting of the graphics after each dependent frame or one could cancel dependent frame image changes encroaching on the graphics overlay. The indelibleness of the graphics is developed in the software environment. It should be applied and removed as one does protecting a document in wordprocessing.

Puregraphics applications of this imaging system involves a software package addressing the pixels by location, multiplies or divides the image for changes as would be done within the pixel matrix making a one pixel image that for four, nine, sixteen, twenty-five or to telescope it to the line reduction schemes, one color pixel per pixel unit, four color pixels per pixel unit The color selection and coding can be done before or after image creation. The computer software must emulate the camera processor having both the color block and variance function and the data field function. One can layer and remove by storing the created layers and adding them and removing them by template since the background is as color coded as the graphics themselves.

Line print fonts, type-setting and font size changes as well as all manner of justification can be done by automatic line assignments for the font size and line spacing prescribed. Though more pixel units are involved, the mathematics are easily created to allow the zoom expansion in area or linear in either direction.

A video image of a printed page should be font converted to allow keyboard editing with in-kind fonts. Similarly, a video image of a damaged photograph or art work can be passed through default processing of the camera contained in the video simulation of the computer software allowing restoration of the image. Targeting debris coloration, this color can be cancelled and the open locations integrated with the default program to bring in sequential rings of added color. The graphics artist can make some guesstimates of the missing parts and further default program additions can be added until the area is repaired and not noticeable as being replaced. Films needing restoration can be so processed with input of sequential frames which may not be damaged. The whole film then is on flexible disc and can be shown in electronic medium. Actually if damaged coloration is input to cancel treatment and the motion sequence input from the new scene frame making an independent image, the dependent frames in the sequence may self repair most of the damage automatically in the Delta Compression process as well as with the default correction.

If the independent frame is that which is damaged, the film can be run in reverse starting with the last frame in the sequence and when the initial damaged frame is viewed with the above assists, the image can be quite complete. Still framing that frame, the image sequence can then be reconstructed in the proper direction for correct sequence viewing.

Touch screen manipulation of either video or graphics images allows the portion of the 4000 by 4000 points over the display to enable palette contact and additions and subtractions from image components with finger or stylus. Touching a region of the picture can pick up the color coding from that location and copy it to the new location. This can apply to creation of new art as well as restoration and better than airbrush image corrections.

Touch screen manipulation of the image allows direct location of the change to be worked on, not the secondary location as with the computer mouse or input board. The task is made easy for novices and may over time be favored by those adept at the current graphics techniques. Cost factors can balance out as touchscreens become more widely accepted and boost their sales volume.

Double touch or touch and joystick selection of colors from the three dimensional color wheel gives 256~ colors or U.S. Pat. No. 4,294,967,296 different shades with the red, green, blue and grey scale combined. Selecting different shades for the basic colors of pure red, pure green and pure blue is mathematically achieved in the processing of the color block and variance data either in the camera processor or in the computer simulation. It can reconstruct any video or graphics segment with the new hue levels.

What about presenting color level conversions based on a four dimension system on three wires to the electron guns? The intensity or grey scale factor adjusts the voltage levels lightening or darkening the color tones. Thus the three color system lasts. The brightening and pastel creation is done by adding a blend of a balanced RGB signal. Conversely, the darkening and greying down of the color is added by low level additions of the other two colors at a balance so as to draw a blackening or browning phenomenum.

Therefore, it is shown that with a case specific design of the photodiode array output, efficient data compression can result, adequate default coloration can occur, and, with reuse of the masks used in production of the elaborate chip, a cost efficient, default diffusing, high performing electronic component is produced. This production process can apply to the secondary processors used in the camera circuitry and to any other integrated circuit or computer memory device adaptable to these procedures. The signal is developed on the electronic chip sequence and provides a 31bit word signal ably decoded at the delivery end by monitors built in this mosaic monitor means as well as for monitors of other designs providing resolution over 1990 and earlier standards. Graphics is accommodated both in conjunction with video and alone, still and motion.

[claims are here ordered as to the topic starting with the display, audio and the associated image processor, graphics input and other display related functions. Then it covers the camera with gross designs, calibration, the photodiode array fabrication and method of signal delivery, signal camera output, processing, editing, and disc recording, printing applications and security means.

Therefore, these claims are made:

1. An area array photosensitive device comprising:
 a plurality of photodiode devices generating electrical output signals representative of detected light, arranged adjacent one another in a substantially flat array defining an optical image plane; and
 output circuitry connected to said photodiode devices for generating a multichannel output signal representing contiguous areas defined by a plurality of lines and a plurality of crosspoints of said optical plane.

2. The photosensitive device in accordance with claim 1 wherein said each channel of said multichannel output signal defines signals representative of light detected at predetermined groups of said photodiode devices.

3. The photosensitive device in accordance with claim 2 wherein said output circuitry further comprises clock circuitry and wherein each of said channels defines signals representative of light levels detected at a predetermined group of said photodiode devices at predetermined times defined by said clock circuit.

4. The photosensitive device in accordance with claim 3 wherein said output circuitry comprises a plurality of output conductors and wherein said clock circuitry comprises a plurality of gate circuits connected between said photosensitive devices and said output conductors and a first set and a second set of clock leads, at least one of said clock leads of said first set and at least one of said clock leads of said second set connected to each of said gate circuits, and control circuitry for activating clock leads of said first and said second sets for selectively gating said output signals from said photodiode devices to said output conductors.

5. The photosensitive device in accordance with claim 1 wherein said plurality of photodiode devices comprises a plurality of groups of said photodiode devices and wherein said output circuitry comprises a plurality of output conductors, each connected to a selected one of said photodiode devices in each of said groups of photodiode devices.

6. The photosensitive device in accordance with claim 5 wherein said area array comprises opposite sides and wherein said plurality of photodiode devices comprises a first row of photodiode devices and a second row of photodiode devices adjacent said first row, each row extending form one side of said area array to an opposite side and wherein said plurality of output conductors comprises a first plurality of output conductors connected to photodiode devices of said first row and terminating on one of said sides of said area array and a second plurality of output conductors connected to photodiode devices of said second row and terminating on an opposite side of said area array.

7. The photosensitive device in accordance with claim 5 and further comprising a plurality of gating circuits, each of said gating circuits connected to one of said photodiode devices and one of said output conductors for gating output signals from said photodiode devices to said output conductors on a timed basis such that output signals from different groups of said photodiode devices are gated to a selected group of said output conductors in a predetermined time slot.

8. The photosensitive device in accordance with claim 7 wherein said area array comprises a rectangular array having opposite sides and rows and columns of photodiode devices and wherein a group of photodiode devices comprises a plurality of rows and a plurality of columns and wherein each photodiode device of a group is connected to an individual one of said output conductors and output signals of all photodiode devices of a group are gated simultaneously to their connected output conductors.

9. A photosensitive imaging device comprising:
 a plurality of photodiodes arranged in lines and cross points defining a planar array; and
 output circuitry for generating output signals simultaneously from a number of photodiodes in a subarray defined by a plurality of adjacent lines and a plurality of adjacent cross points.

10. The photosensitive imaging device according to claim 9, further comprising clock circuitry for gating output signals from the photodiodes including:

a first set of gate circuitry corresponding to the lines of the array; and a second set of gate circuitry corresponding to the cross points of the array.

11. The photosensitive imaging device according to claim 9, wherein the output circuitry further comprises connector wires extending from each photodiode to a set of rail wires for transmission of the output signal to a side of the planar array, with the number of connector wires and rail wires for a given sub-array of photodiodes corresponding to the number of lines and cross points of the sub-array.

12. The photosensitive imaging device according to claim 11, further comprising a set of layered substrates;

for each line in a given sub-array, each rail wire for each cross point of the sub-array being constructed on a separate layer; and each connector wire extending from its respective photodiode through the substrates to its corresponding rail wire.

13. The photosensitive imaging device according to claim 9, wherein the planar array has two sides, and a first set output signals form photodiodes on a first set of lines is transmitted on a first set of corresponding rail wires to the first side of th array, and a second st of output signals form photodiodes on a second set of lines is transmitted on a second set of corresponding rail wires to the second side of the array.

14. The photosensitive imaging device according to claim 9, wherein each photodiode comprises a block of silicon doped on the outer surface thereof with a dielectric for a selected peak wave band of the light spectrum.

15. The photosensitive imaging device according to claim 14, further comprising multiple planar arrays of photodiodes, with each array being doped with a dielectric specific to a different wave band for the primary colors of the image.

16. The photosensitive imaging device according to claim 13, further comprising: the array being divided into a plurality of segments, with each segment being comprised of a plurality of sub-arrays, for generating output signals simultaneously from at least one sub-array in each segment.

17. The photosensitive imaging device according to claim 16, wherein each segment has separate gate circuitry corresponding to the lines of the array, and all segments have common gate circuitry corresponding to the cross points of the array.

* * * * *